US012382842B2

(12) United States Patent
Moon et al.

(10) Patent No.: US 12,382,842 B2
(45) Date of Patent: Aug. 5, 2025

(54) SUPERCONDUCTING WIRE AND METHOD OF FORMING THE SAME

(71) Applicants: SUNAM CO., LTD., Anseong-si (KR); CAMBRIDGE ENTERPRISE LIMITED, Cambridge (GB)

(72) Inventors: Seung-Hyun Moon, Seoul (KR); Judith Driscoll, Cambridge (GB); Ahmed Kurusumovic, Cambridge (GB); John Feighan, Cambridge (GB)

(73) Assignees: SUNAM CO., LTD., Anseong-si (KR); CAMBRIDGE ENTERPRISE LIMITED, Cambridge (GB)

( * ) Notice: Subject to any disclaimer, the term of this patent is extended or adjusted under 35 U.S.C. 154(b) by 1149 days.

(21) Appl. No.: 17/230,118

(22) Filed: Apr. 14, 2021

(65) Prior Publication Data
US 2022/0140222 A1 May 5, 2022

(30) Foreign Application Priority Data

Nov. 3, 2020 (KR) .................. 10-2020-0144923
Mar. 22, 2021 (KR) .................. 10-2021-0036349

(51) Int. Cl.
*H10N 60/01* (2023.01)
(52) U.S. Cl.
CPC ..... *H10N 60/0632* (2023.02); *H10N 60/0801* (2023.02); *H10N 60/0828* (2023.02)

(58) Field of Classification Search
CPC .......... H10N 60/0632; H10N 60/0801; H10N 60/0828
See application file for complete search history.

(56) References Cited

U.S. PATENT DOCUMENTS

| 10,741,743 | B2 | 8/2020 | Araki et al. |
| 2005/0159298 | A1* | 7/2005 | Rupich .............. H10N 60/0828 502/100 |
| 2010/0081574 | A1 | 4/2010 | Goyal |
| 2011/0034336 | A1 | 2/2011 | Goyal et al. |
| 2014/0342916 | A1 | 11/2014 | Moon et al. |

FOREIGN PATENT DOCUMENTS

| CN | 105525267 A | 4/2016 |
| KR | 10-2019-0058234 A | 5/2019 |
| RU | 2 597 247 C2 | 9/2016 |
| RU | 2 662 040 C1 | 7/2018 |

(Continued)

OTHER PUBLICATIONS

Feighan, et al., "Strong pinning at high growth rates in Rare Earth Barium Cuprate", arxiv.org, Cornell University Library, 201 Olin Library Cornell University Ithaca, NY 14853, Nov. 2, 2020.

(Continued)

*Primary Examiner* — Paul A Wartalowicz
(74) *Attorney, Agent, or Firm* — Lee IP Law, P.C.

(57) ABSTRACT

Provided is a superconducting wire. The superconducting wire comprises a substrate, a superconducting film on the substrate and a pinning center in the superconducting film. The superconducting film includes $Y_{1-x}RE_xBCO$ and the pinning center has an additive of $Ba_2YNbO_6$.

11 Claims, 11 Drawing Sheets

(56) References Cited

FOREIGN PATENT DOCUMENTS

WO     WO 2011/017439 A1     2/2011
WO     WO 2013/109065 A1     7/2013

OTHER PUBLICATIONS

Extended European Search Report dated Oct. 1, 2021 for corresponding EP 21168444.4.
Kursumovic et al., Applied Physics Letters 87, 2005.
Lee et al., REC-DR, a novel process for coated conductor fabrication with high performance, 2014.
Judith L. MacManus-Driscoll, High Ic in YBCO Films Grown at Very High Rates by Liquid Mediated Growth, IEEE, 2009.

* cited by examiner

| Composition # | RE:Ba:Cu ratio | RE Composition (Y 80% + other RE(s) 20%) | Film Composition Acronym | |
|---|---|---|---|---|
| (a) | 1:2:3 | Y | Y123 | w/o LAP |
| (b) | 1:1.7:2.7 | Y | Y123 + liquid | LAP |
| (c) | 1:1.7:2.7 | Y, Yb | (Y,Yb)123 + liquid | LAP |
| (d) | 1:1.7:2.7 | Y, Sm | (Y,Sm)123 + liquid | LAP |
| (e) | 1:1.7:2.7 | Y, Yb, Sm | (Y,Yb,Sm)123 + liquid | LAP |
| (f) | 1:1.7:2.7 | Y | Y123 + liquid + BYNO | LAP |
| (g) | 1:1.7:2.7 | Y, Yb, Sm | (Y,Yb,Sm)123 + liquid + BYNO | LAP |

| Composition # | $T_E$ (°C) | $T_P$ (°C) |
|---|---|---|
| (a) | - | 950.6 |
| (b) | 835.2 | 937.5 |
| (c) | 809.4 | 932.6 |
| (d) | 822.9 | 956.9 |
| (e) | 811.1 | 940.8 |
| (f) | 835.8 | 938.8 |
| (g) | 817.9 | 940.5 |

FIG. 6

| Growth Temp. (°C) | $T_C$ (K) | c (Å) (± 0.001Å) | FMHM of (005) peak in θ-2θ scan(°) | FMHM of (005) peak in rocking curve(°) |
|---|---|---|---|---|
| 750 | 84.0 | 11.724 | 0.522 | 0.578 |
| 780 | 86.5 | 11.726 | 0.436 | 0.512 |
| 790 | 88.7 | 11.726 | 0.412 | 0.497 |
| 800 | 89.0 | 11.720 | 0.392 | 0.470 |
| 810 | 89.7 | 11.718 | 0.355 | 0.472 |
| 820 | 91.2 | 11.716 | 0.318 | 0.405 |
| 830 | 90.3 | 11.714 | 0.346 | 0.431 |
| 850 | 88.6 | 11.713 | 0.255 | 0.510 |

FIG. 7

| Composition # | $T_C$ (K) | c parameter (Å) | Lowest FWHM of (005) peak in θ-2θ | Rocking curve width of (005) peak | $J_C$ (MA.cm$^{-2}$) @ 50K and 5T | $J_C$ (MA.cm$^{-2}$) @ 10K and 10T |
|---|---|---|---|---|---|---|
| (a) | 79.1 | 11.72 | 0.369 | 0.348 | 0.8 | 1.4 |
| (b) | 91.2 | 11.72 | 0.318 | 0.405 | 1.7 | 4.5 |
| (c) | 86.9 | 11.67 | 0.472 | 0.594 | 0.8 | 3.8 |
| (d) | 85.2 | 11.74 | 0.523 | 0.587 | 0.9 | 4.7 |
| (e) | 88.4 | 11.71 | 0.427 | 0.542 | 1.5 | 4.3 |
| (f) | 89.3 | 11.71 | 0.345 | 0.530 | 2.1 | 4.6 |
| (g) | 86.6 | 11.71 | 0.384 | 0.519 | 2.0 | 7.7 |

SUPERCONDUCTING WIRE AND METHOD OF FORMING THE SAME

CROSS-REFERENCE TO RELATED APPLICATION

Korean Patent Application No. 10-2020-0144923, filed on Nov. 3, 2020, and Korean Patent Application No. 10-2021-0036349 filed on Mar. 22, 2021, in the Korean Intellectual Property Office, and entitled: "Superconducting Wire and Method of Forming the Same," is incorporated by reference herein in its entirety.

FIELD OF INVENTION

The present disclosure herein relates to a superconducting wire.

BACKGROUND

A superconductor loses all its resistance below critical temperature and a large amount of an electric current may pass through the superconductor without loss. Recently, a second generation high temperature superconducting wire (Coated Conductor) including a superconducting film on a metal substrate or on a thin buffer layer including a biaxially aligned textured structure has been studied. Compared to a metal conductor, the second generation high temperature superconductor can transmit much more electric current per unit area of its cross-section. The second generation high temperature superconducting wire may be used in superconducting power transmission and distribution cable with low power loss, a magnetic resonance imaging (MRI), a magnetic levitation train, a superconducting propulsion ship, etc.

SUMMARY

The present disclosure provides a method of forming a superconducting wire. The method of forming the superconducting wire may comprise: forming a buffer layer on a substrate; and providing a superconducting precursor on the buffer layer, to form a superconducting film including $Y_{1-x}RE_xBCO$ on the substrate, wherein the superconducting precursor is provided using a source including Y+RE (where RE may be one or more rare earth elements), Ba, and Cu, and the source is rich in Y+RE and Cu compared to a stoichiometric YBCO.

In one embodiment, it may be $0.5<x<0.95$.

In one embodiment, RE may be Yb, Sm or a combination of Yb and Sm.

In one embodiment, the source further may include an additive of $Ba_2YNbO_6$.

In one embodiment, RE may include a first element having a smaller ionic radius than that of Y and a second element having a larger ionic radius than that of Y.

In one embodiment, the first element may include Yb and the second element may include Sm.

In one embodiment, the superconducting precursor may be provided in the range of 800~850° C.

In one embodiment, the superconducting film may further include $Y_2O_3$ and liquid phase.

The method of forming the superconducting wire may comprise: forming a buffer layer on a substrate; and providing a superconducting precursor on the buffer layer, to form a superconducting film including $Y_{1-x}RE_xBCO$ on the substrate, wherein the superconducting precursor is provided using a source including Y+RE, Ba, and Cu, and wherein RE includes a first element having a smaller ionic radius than that of Y and a second element having a larger ionic radius than that of Y.

In one embodiment, the first element may include Yb and the second element may include Sm.

In one embodiment, the source may further include an additive of $Ba_2YNbO_6$.

The present disclosure provides a superconducting wire. The superconducting wire may comprise: a substrate; a superconducting film on the substrate; and a pinning center in the superconducting film, wherein the superconducting film includes $Y_{1-x}RE_xBCO$, $Y_2O_3$ and liquid phase, and the pinning center has an additive of $Ba_2YNbO_6$.

In one embodiment, RE may include a first element having a smaller ionic radius than that of Y and a second element having a larger ionic radius than that of Y.

In one embodiment, the first element may include Yb and the second element may include Sm.

In one embodiment, the additive of $Ba_2YNbO_6$ may have a column shape.

In one embodiment, the column may have a c-axis orientation.

In one embodiment, the column may have a diameter of 3~10 nm and a spacing of 10~30 nm.

The superconducting wire may comprise: a substrate; a superconducting film on the substrate; and a pinning center in the superconducting film, wherein the superconducting film includes $Y_{1-x}RE_xBCO$ and the pinning center has an additive of $Ba_2YNbO_6$, wherein RE includes a first element having a smaller ionic radius than that of Y and a second element having a larger ionic radius than that of Y.

In one embodiment, the first element may include Yb and the second element may include Sm.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Also, since exemplary embodiments are described, reference numerals disclosed according to the sequence of description are not limited to the sequence.

The present invention is related to applications where high critical currents can be achieved in high fields. It is also aimed at lower cost conductor. This necessitates creating films at fast growth rates with strong pinning of magnetic vortex.

To achieve fast growth rates, the presence of liquids during growth is highly beneficial. To achieve strong pinning in the field range of interest, a mixed pinning morphology is needed, i.e. extended 1D (columnar) artificial pinning centers (APCs) and 0D-like point defects.

To achieve the aforementioned goals of high performance at fast growth rates, a new process termed liquid assisted processing (LAP) in PLD has been developed. LAP is a simple in-situ process in which small (for example, ~6 vol. %) liquid fractions are incorporated in the films during growth, through the use of a non-stoichiometric target. The method is expected to be adaptable to a wide range of physical or chemical vapor deposition processes.

The present invention creates a mixed pinning landscape of both columnar APCs and isotropic low dimensional point pinning defects. To create columnar APCs in the film, it is needed to be selective about which APCs will form in the presence of the liquid.

Point pinning defects will be created by using mixed rare-earths REBCO films, i.e. using at least two REs of different atomic sizes to create $RE1_{1-x}RE2_xBCO$ films. The difference in the size of the RE ions (ion size variance) leads to localized regions of strain within the lattice which can potentially act as pinning sites. Additionally, for rare-earth ions of a similar size to the $Ba^{2+}$ ion, Ba-RE cross substitution occurs creating further point defects. x needs to be small in $RE1_{1-x}RE2_xBCO$ so that the growth temperature can be optimized for RE1. If x is large, the growth temperature would not be optimized for either RE1 or RE2 and this would lead to poor overall crystallinity and likely irregular buckling of the CuO planes, both being detrimental to superconductivity. x may be $0.5<x<0.95$.

Samples with a mixed rare-earth component have been shown to have mildly improved performance at 77 K. However, it is at lower temperatures that such point defects are expected to be most beneficial, and they will become the major contribution to the vortex pinning force at low temperatures.

Figure 1:
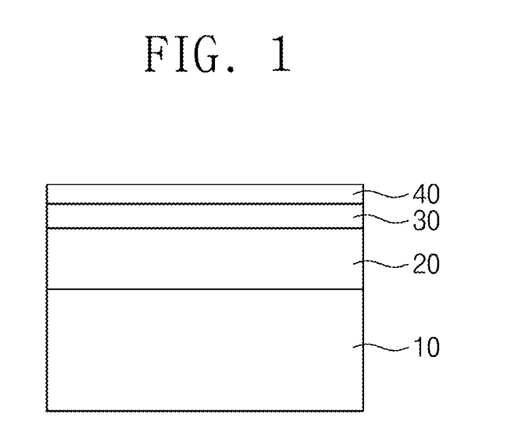
FIG. 1 shows a cross-sectional view of a superconducting wire according to the present invention.

FIG. 1 shows a cross-sectional view of a superconducting wire according to the present invention. Referring to FIG. 1, the superconducting wire 100 may comprise a substrate 10, a buffer layer 20, a seed layer 30, and a superconducting film 40.

The substrate 10 may have a biaxially aligned textured structure. The substrate 10 may be a metal substrate. The metal substrate 10 may include a cubic lattice metal, such as nickel (Ni), nickel alloys (Ni—W, Ni—Cr, Ni—Cr—W, etc.), a stainless steel, silver (Ag), silver alloys, nickel-silver composites which are hot rolled. The substrate 10 may have a tape shape for a coated conductor.

The buffer layer 20 may include a diffusion stop layer (e.g., $Al_2O_3$), $Y_2O_3$, and an MgO layer which are stacked sequentially. The buffer layer 20 may be formed by an IBAD method. An epitaxially grown homoepi-MgO layer may be further formed on the buffer layer 20. An additional layer may be further formed on the buffer layer 20. The additional layer may include $LaMnO_3$, $LaAlO_3$ or $SrTiO_3$. The additional layer may be formed by a sputtering method. The buffer layer 20 and the additional layer may prevent a reaction between the metal substrate and the superconductor material on the metal substrate and transfer crystalline properties of the biaxially aligned textured structure.

The seed layer 30 is formed on the buffer layer 20. The seed layer 30 may include, for example, zirconium oxide, zirconium, tin oxide, titanium oxide, titanium, hafnium oxide, hafnium, yttrium oxide, cesium oxide, or cesium. The metal oxides, such as zirconium oxide, tin oxide, titanium oxide, hafnium oxide, yttrium oxide, cesium oxide, and the like may further include barium. The seed layer 30 may be formed by a sputtering method or an electron beam method.

The superconducting film 40 is formed on the seed layer 30. The superconducting film 40 is formed by the LAP method.

Experimental Embodiments

Figure 2:
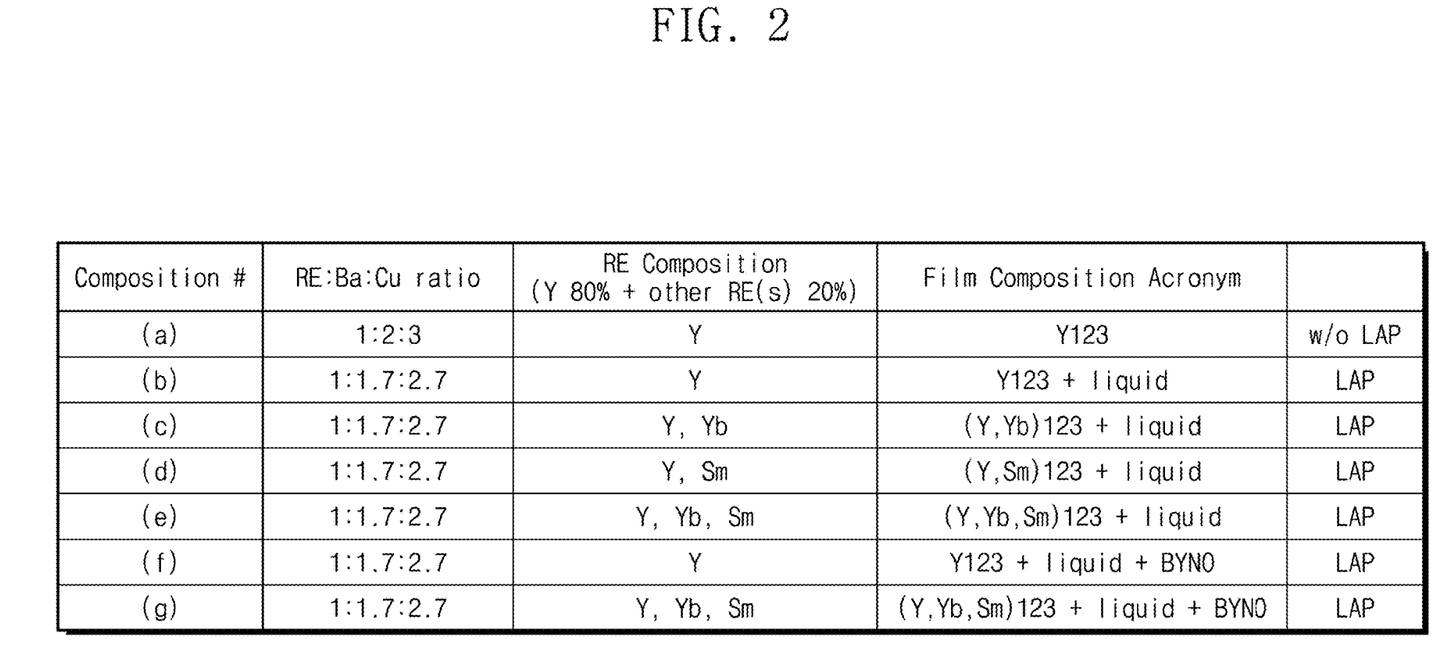
FIG. 2 shows compositions of samples used in the present invention.

FIG. 2 shows compositions of samples used in the present invention. Sources (for example, PLD targets) were made from single phase powders of $Y_2O_3$, $Ba(NO_3)_2$, CuO and, where needed, powders of $Sm_2O_3$ and $Yb_2O_3$. All powders were weighed to the appropriate amounts, mixed, ground, pressed and finally reacted at 850° C. in oxygen for 24 hours. The sources were then re-ground and re-sintered to ensure homogeneity and a complete reaction occurred. Referring to FIG. 2, seven different composition sources were made, such as (a) Y123, (b) Y123+liquid, (c) (Y,Yb)123+liquid, (d) (Y,Sm)123+liquid, (e) (Y,Yb,Sm)123+liquid, (f) Y123+liquid+BYNO, and (g) (Y,Yb,Sm)123+BYNO. Films of six compositions (b)~(g) will be prepared by using the LAP process. Film of composition (a) will be prepared without using the LAP process, as a reference.

For four mixed RE sources (c), (d), (e), and (g), the atomic percentage of Y was 80% so that the growth temperature could be kept the same for all films. To balance the 80 at. % Y, and hence ensure stoichiometry, 20% additions of the RE additives was used. Rare-earths smaller ($Yb^{3+}$), larger ($Sm^{3+}$) or a combination of smaller and larger ($Yb^{3+}$, $Sm^{3+}$) than the matrix rare-earth ($Y^{3+}$) was used.

Two RE sources (f) and (g) had additives of 2~10 mol. % (for example, 5 mol. %) $Ba_2YNbO_6$ (BYNO). For single phase BYNO powder, powders of $Y_2O_3$, $Ba(NO_3)_2$, and $Nb_2O_5$ were weighed, mixed, ground, and then reacted at 1450° C. in oxygen for 24 hours. The BYNO powders were then mixed with YBCO powders in about 5 mol. % composition ratios, pressed, and then sintered at 950° C. in oxygen for 12 hours. BYNO additions produce strong c axis pinning (up to twice the $J_c$ for H||c as compared to pure YBCO films), even at relatively high growth rates (>1 nm/s). Hence, BYNO APCs can self-assemble into nanocolumns at high growth rates where other APCs cannot. Since LAP is a fast process, it is important to use an APC which will assemble into nanocolumns (rather than nanoparticles) at fast growth rates.

Figure 3:
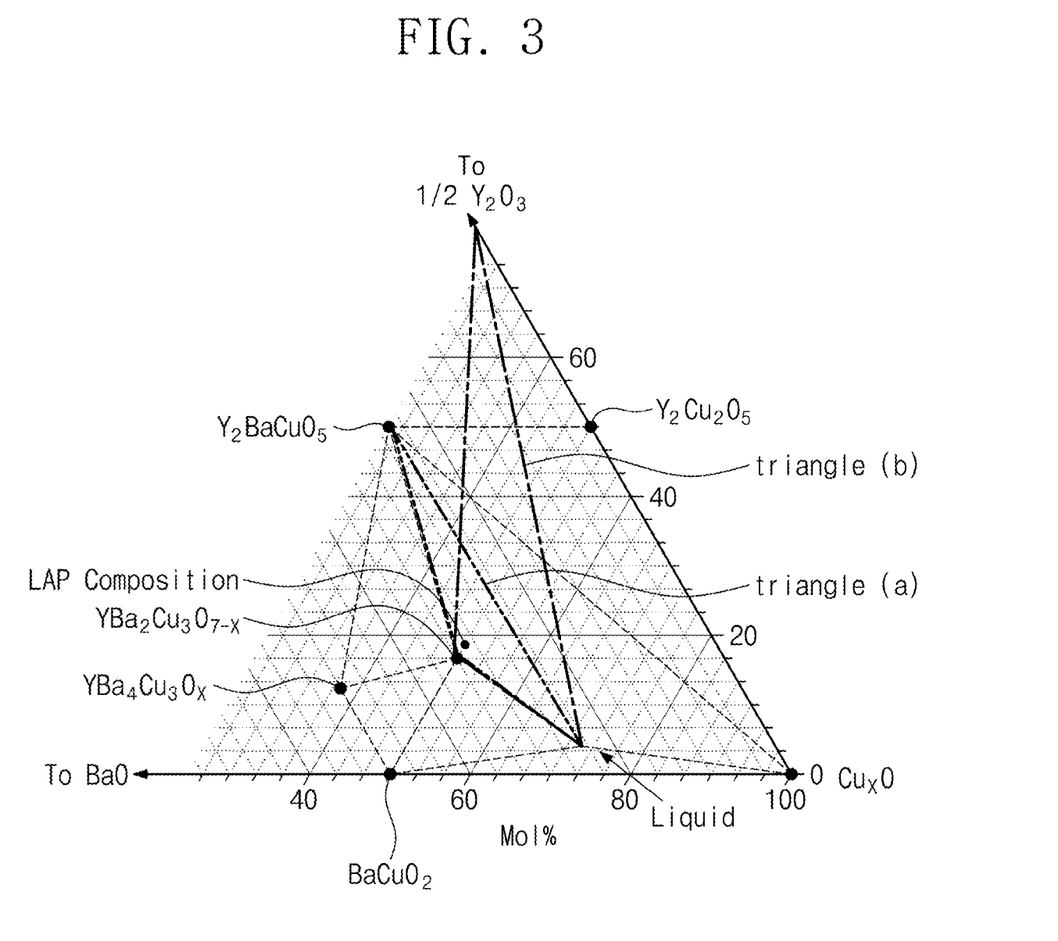
FIG. 3 shows ternary phase diagram of Y—Ba—Cu.

FIG. 3 shows ternary phase diagram of Y—Ba—Cu under a constant low $pO_2$ (<0.1 Torr.) and temperature of 800° C. Although at equilibrium the phases expected to form are given by the equilibrium tie triangle (a) around the composition of interest, kinetic and epitaxial growth effects modify this, leading instead to the formation of YBCO, liquid and $Y_2O_3$ (shown by the 'kinetic' tie triangle (b)). In this case, some of our compositions have 20% of other REs substituted for Y, but the phase diagram is assumed to be qualitatively the same as for pure Y.

The position of the (Y+RE):Ba:Cu ratio used in all the sources (for example, targets for PLD) is shown on the phase diagram of FIG. 3 as a triangle (b). Only Y rather than Y+RE is shown on the diagram for simplicity. The compositions (b)~(g) are also listed in FIG. 2, i.e. their (Y+RE):Ba:Cu ratio=1:1.7:2.7, i.e. a source is rich in Y+RE, and Cu compared to YBCO (as can be more easily seen if the composition is normalized to Ba=2, namely 1.18:2.00:3.18). Hence the source is both Y+RE rich and Cu rich compared to the stoichiometric 1:2:3 of composition (a).

Referring to FIG. 3, the 1:1.7:2.7 composition will form a mixture of (Y+RE)BCO, liquid and $Y_2BaCuO_5$ (see triangle (a)). However, owing to kinetic factors and epitaxial stabilization by the forming c-aligned (Y+RE)BCO, (Y+RE)$_2O_3$ is formed in the films instead of (Y+RE)$_2BaCuO_5$ during LAP growth. Hence, the phases which is formed are those at the vertices of the 'kinetic' tie triangle (b), i.e. 1:2:3+liquid+$Y_2O_3$ (the (Y+RE)$_2O_3$ mixed composition is ignored, for simplicity here). The position of the liquid phase boundary is not precisely known under the conditions found during growth and is estimated in FIG. 3. However an approximation of the phase ratios, assuming the positions shown in the 'kinetic' tie triangle (b), gives the mol. % and approximate vol. % (assuming equal volume per atom) of YBCO, $Y_2O_3$ and liquid during the growth to be 88 mol. %, 10 mol. % and 2 mol. %, or 91 vol. %, 3 vol. % and 6 vol. %, respectively.

Figure 4:
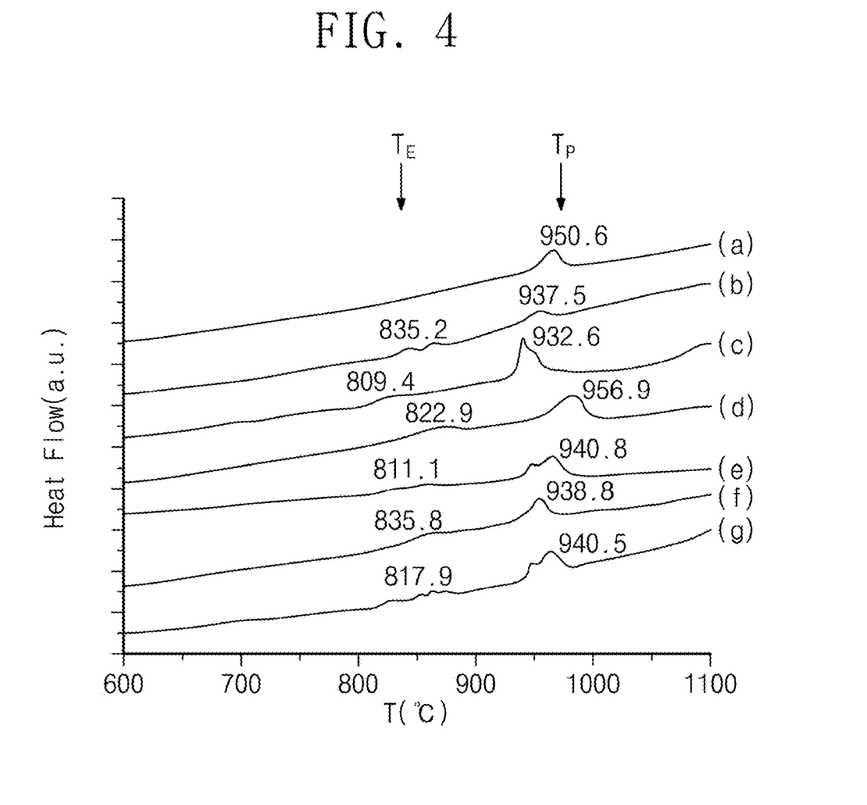
FIG. 4 shows differential scanning calorimetry (DSC) scans from powders of the compositions of samples used in the present invention.
Figure 5:
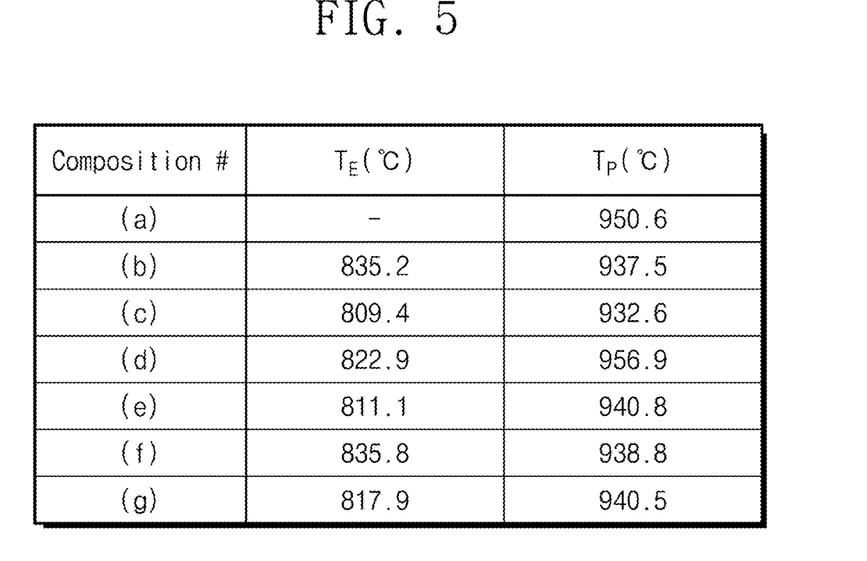
FIG. 5 shows eutectic and peritectic temperatures measured by DSC under $N_2$ for the compositions used in FIG. 4.

FIG. 4 shows differential scanning calorimetry (DSC) scans from powders of the compositions discussed here. DSC measurements were conducted using a TA Instruments Q600 SDT on about 10 mg of ground sintered sources material. Heating rates of 15° C./min were in a nitrogen atmosphere. FIG. 5 shows eutectic and peritectic temperatures ($T_E$ and $T_P$, respectively), measured by DSC under $N_2$ for the compositions used in FIG. 4.

Referring to FIGS. 4 and 5, the temperatures for the onset of liquid formation ($T_E$ the eutectic temperature and $T_P$ the peritectic temperature) in a nitrogen atmosphere for the different compositions is obtained. It is noted that, due to the nitrogen rich atmosphere, $T_P$ is reduced by ~50° C. compared to air. Additionally, melting peaks in the doped samples are at lower temperatures relative to composition (a).

The pure YBCO, Y123 (composition (a)) shows only $T_P$ as the composition is stoichiometric. On the other hand, liquid assisted compositions show a $T_E$ melting peak at a temperature lower than $T_P$, between 809.4~835.2° C., consistent with the $Ba_2Cu_3O_y$ liquid phase melting temperature at low $pO_2$. $T_P$ is also higher for the (Y,Sm)123+liquid (composition (d)) at 956.9° C., compared to the Y123+liquid (composition (b)) at 937.5° C., which is expected because of the higher melting temperature of Sm123, namely 1060° C., than Y123, 1005° C. Likewise, the $T_P$ for (Y,Yb)123+liquid (composition (c)) was 932.6° C., which is lower than for Y123 (composition (a)), again expected due to the lower $T_P$ of Yb123 compared to Y123. (Y,Yb,Sm)123+liquid (composition (e)), containing all three REs, showed double/broader peaks, and the $T_E$ and $T_P$ temperatures determined from these peaks were 811.1° C. and 940.8° C., which are closer to the Yb-containing composition, indicative of the presence of phase separation and the formation of two liquids. Furthermore, compositions doped with BYNO had similar $T_P$ and $T_E$ to the compositions without BYNO. Having only a small change in melting temperatures on adding BYNO is expected as BYNO is not expected to interact with the Y123 system.

The eutectic and peritectic temperature data guide understandings of the optimum growth temperature to use for the films. The minimum requirement for the LAP process to work is for there to be a liquid present. This means operating marginally above $T_E$. 800~850° C. (for example, 820° C.) may be a suitable temperature for all compositions. A higher temperature may also be good (so long as the substrate and buffer remaining stable). However, since the $T_E$ and $T_P$ values varied by more than 25° C. across compositions, there would certainly be scope for further individual growth temperature optimization for each specific composition.

All films are grown by providing a superconducting precursor on the buffer layer from the sources. For the pulsed laser deposition (PLD), a Lamba Physik KrF excimer laser was used ($\lambda$=248 nm, fluence ~2 J/cm$^2$). A laser pulse repetition rate of 50 Hz was used which created a growth rate of ~250 nm/min. This growth rate is higher than standard YBCO PLD film growth by a factor of about 4~60. The high growth rate is enabled by the presence of a liquid phase in the films during deposition. The growth $pO_2$ of all the films was 200 mTorr, and after growth the films were oxygenated at 500° C. in 760 Torr $pO_2$ for one hour. All films had thicknesses of 350 nm±20 nm. The deposition temperatures of the films were in the range 750° C.~850° C., with the temperature of the heater controlled using a conventional thermocouple-P.I.D. controller.

After growing over this range of temperatures, the optimum growth temperature was determined by finding the lowest value of full-width-half-maximum (FWHM) of the (005) X-ray peak, indicative of very high crystalline perfection and the highest $T_c$ and $J_c$ (77 K, self-field). The optimum growth temperature was 800° C.~850° C. (preferably 810° C.~830° C., more preferably about 820° C.) as below.

The transition temperature ($T_c$) and the critical-current-density-field dependency ($J_c(B)$) were measured using a conventional four-point probe method. The critical current density measurements used a 1 µV cm$^{-1}$ criterion, the maximum Lorentz force configuration, and were conducted on samples etched to have 25 µm wide bridges. The bridges were patterned using a standard photolithographic method with silver electrical contact pads deposited to ensure high quality contact interfaces. After measurement the thicknesses of the films were determined via a Dektak stylus profilometer.

A Philips PW3020 diffractometer employing CuK$\alpha$ radiation was used to carry out structural analysis. X-ray diffraction in the Bragg-Brentano geometry and rocking curves of the (005) YBCO peak, (the highest intensity (001) peak), were carried out to study the phases developed in the films and their epitaxial quality. A FEI Nova NanoSEM was also used to create scanning electron microscope images to investigate the surface of the films. Cross-sectional transmission microscopy (TEM) was used to image the BYNO nano inclusions in the YBCO matrix.

Figure 6:
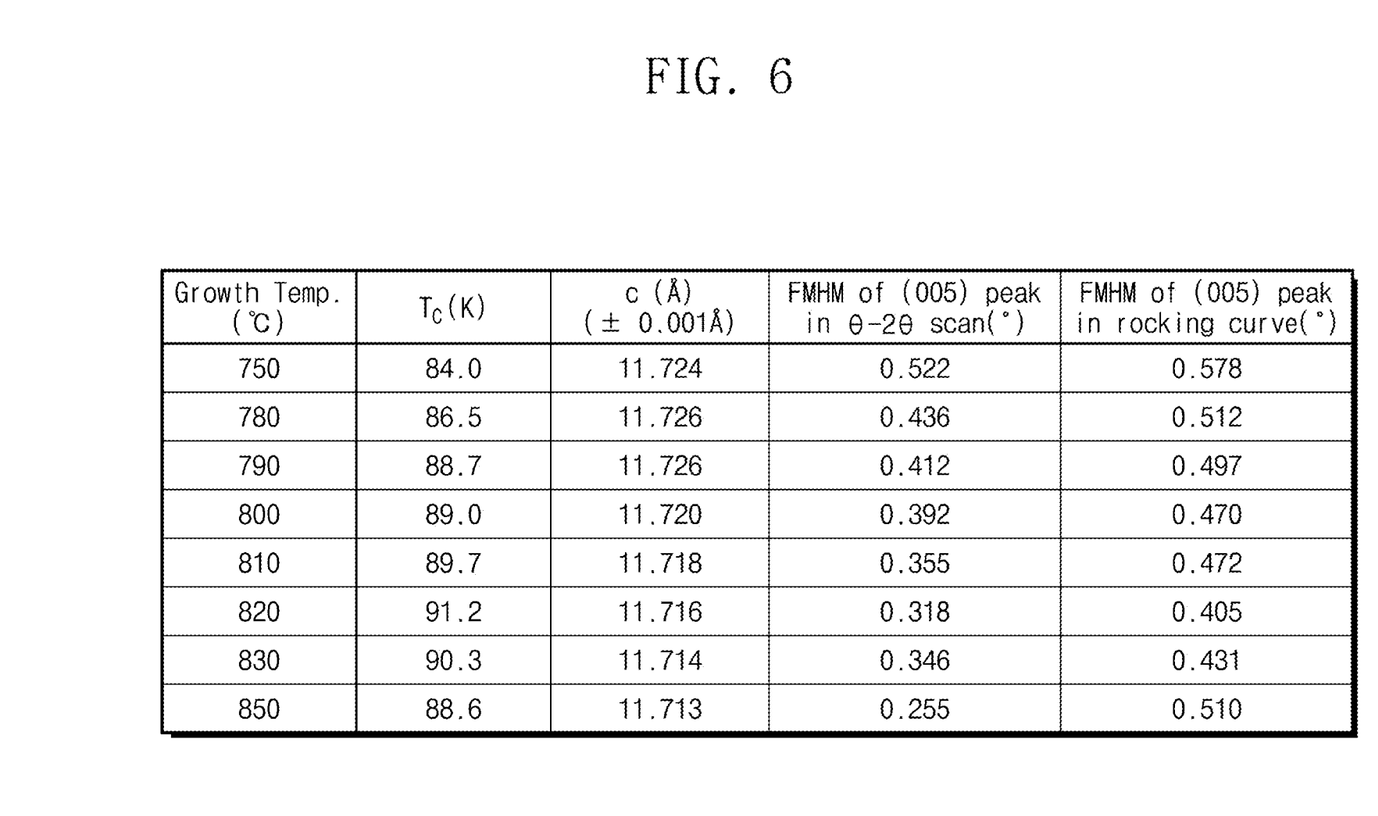
FIG. 6 shows growth temperature, $T_C$, c parameter, and Full Width at Half Maximum (FWHM) of (005) peaks in XRD θ-2θ and ω curves for film Y123+liquid of FIG. 2.

FIG. 6 shows growth temperature, $T_C$, c parameter, and Full Width at Half Maximum (FWHM) of (005) peaks in XRD θ-2θ and ω curves for film Y123+liquid, composition (b) of FIG. 2.

For Y123+liquid (composition (b)), the highest $T_c$ (91.2 K) was measured on films grown at 820° C. This growth temperature is ~15° C. below the $T_E$ for this composition, as shown in FIG. 5. However, the $PO_2$ of the growth atmosphere is lower and so melting here is very likely. A growth temperature of 820° C. gives not only the highest $T_c$ but also the minimum (005) θ-2θ peak FWHM, minimum (005) ω-scan peak FWHM, and lowest c (which appears to plateau at 820° C. and above). All these parameters indicate optimum crystalline perfection at around 820° C. The degradation of $T_c$ at above 820° C. is likely related to minor inter-reaction of the liquid with the substrate for the higher liquid fraction, compared to 820° C.

Referring to FIG. 6, for composition (b), the highest $T_c$ coincides with the lowest level of structural disorder (as determined from the minimum (005) peak FWHM) and the lowest c parameter, both indicative of optimum crystalline perfection. This occurred at 820° C., a temperature at which the film growth would be in the presence of liquid at a $pO_2$ of 200 mTorr. This temperature is higher than that typically used during REBCO PLD growth by more than 30° C., in order to ensure sufficient liquid present.

Figure 7:
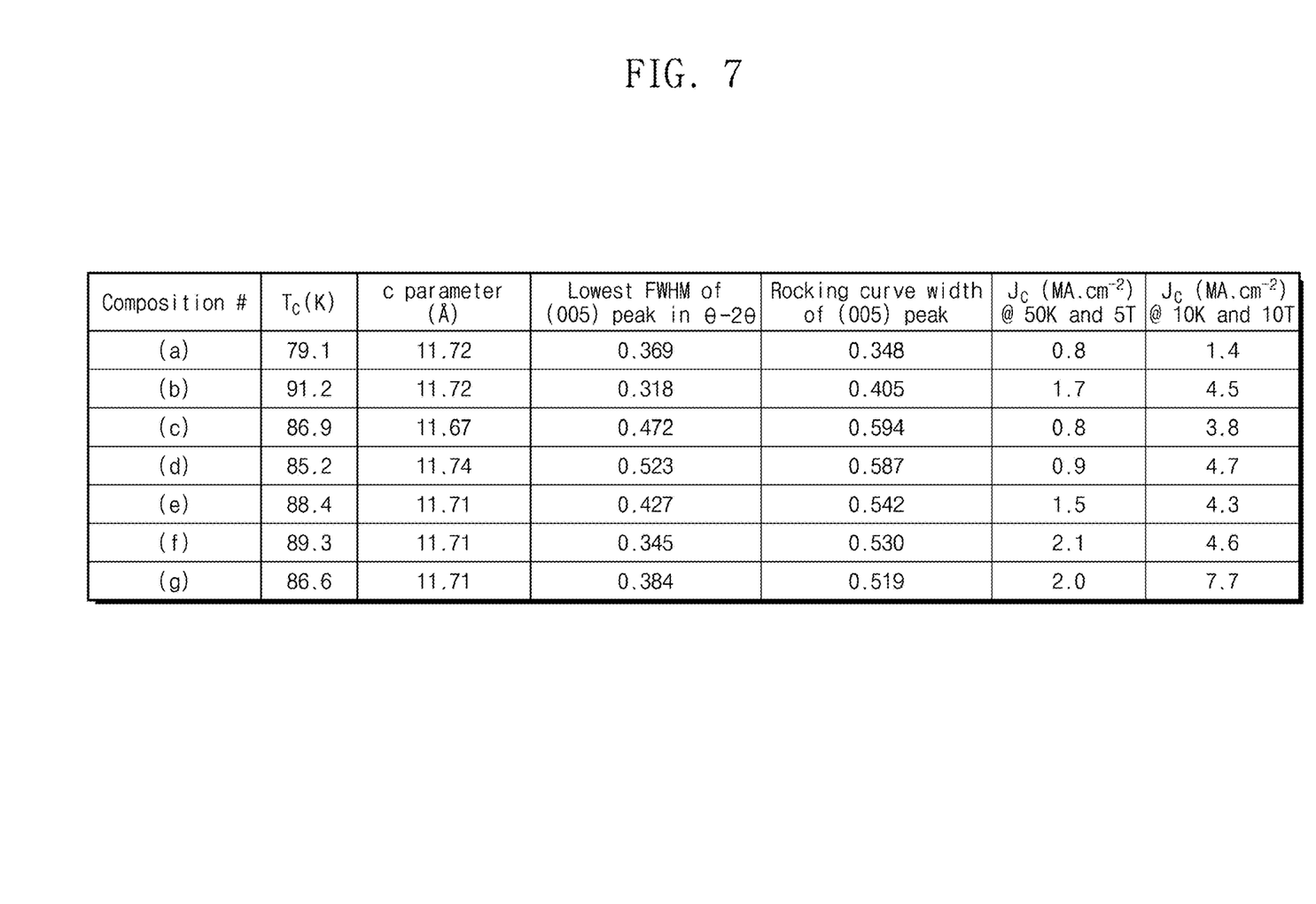
FIG. 7 shows all the compositions discussed and information on their structural features, $T_c$'s and $J_c$'s of the films at different H and T.

FIG. 7 shows all the compositions discussed and information on their structural features, $T_c$'s and $J_c$'s of the films at different H and T. $T_c$'s and c parameters are those at the optimum growth temperature (for example, 820° C.). As determined from the low FWHM of the (005) peaks of θ-2θ and ω scans, the films were all highly aligned and had excellent crystallinity, much more so than the plain YBCO film (denoted Y123 of composition (a)).

Referring again to FIG. 7, the stoichiometric pure YBCO (Y123, composition (a)) film without LAP has a reduced $T_c$ of 79.1 K, because of the growth with no liquid present. The lower $T_c$ may be originated from the structural disorder induced at such high growth rates. The c parameter 11.72 Å is high compared to the bulk value of 11.69 Å found in low-rate-grown YBCO films and is indicative of some cation disorder.

For the mixed RE films, the c parameter trend follows the pattern expected from the size of the rare-earths, with the (Y,Yb)123+liquid (composition (c)) film having the smallest c value (11.67 Å), the (Y,Sm)123+liquid (composition (d)) film having the largest c value (11.74 Å) and the (Y,Yb,Sm) 123+liquid (composition (e)) film in therebetween (11.71 Å). The $T_c$s of the mixed RE (composition (c), (d) and (e)) films with LAP are lower than pure YBCO (composition (b)) film with LAP. Of the mixed RE films, the (Y,Yb,Sm)123+ liquid (composition (e)) film has the highest $T_c$ (88.4 K), higher than the (Y,Yb)123+liquid (composition (c)) and (Y,Sm)123+liquid (composition (d)) films by up to 3 K. This is likely because the average RE ionic radius in these films (i.e. average of large Sm, middle Y and small Yb) of 1.03 Å is close to the radius of pure Y at 1.02 Å, whereas it is either considerably higher or lower for the other compositions.

The $T_c$s for films containing BYNO (compositions (f) and (g)) were slightly lower (by 2 K) than the parent films (compositions (b) and (e)) without BYNO. This is common for REBCO films that include secondary phases due to the structural perturbation of the REBCO lattice by the APC. This is manifest as higher FWHM values in the (005) peak in the θ-2θ and ω scans, i.e. ~0.34° and ~0.53°, respectively, in compositions (f) film. On the other hand, there was only a marginal effect on the c parameter, which agrees with a previous study on BYNO doped YBCO. Hence, while there is structural disruption (i.e. buckling of planes and tilting of grains), there is little or no induced cation disorder induced in the REBCO lattice.

Structural disruption in the mixed RE films would be expected to give rise to higher FWHM values for the (005) peaks in the θ-2θ and ω scans. This is the case for all the mixed RE films. The (Y,Sm)123+liquid (composition (d)) film with the largest structural disorder and the lowest $T_c$ has the largest θ-2θ FWHM value. The (Y,Sm)123+liquid (composition (d)) film has the θ-2θ FWHM of ~0.52°, compared to ~0.32° of the Y123+liquid (composition (b)) film. It also has the largest ω scan FWHM value of all the films, i.e. ~0.59°, compared to ~0.40° of the Y123+liquid (composition (b)) film.

Figure 8A:
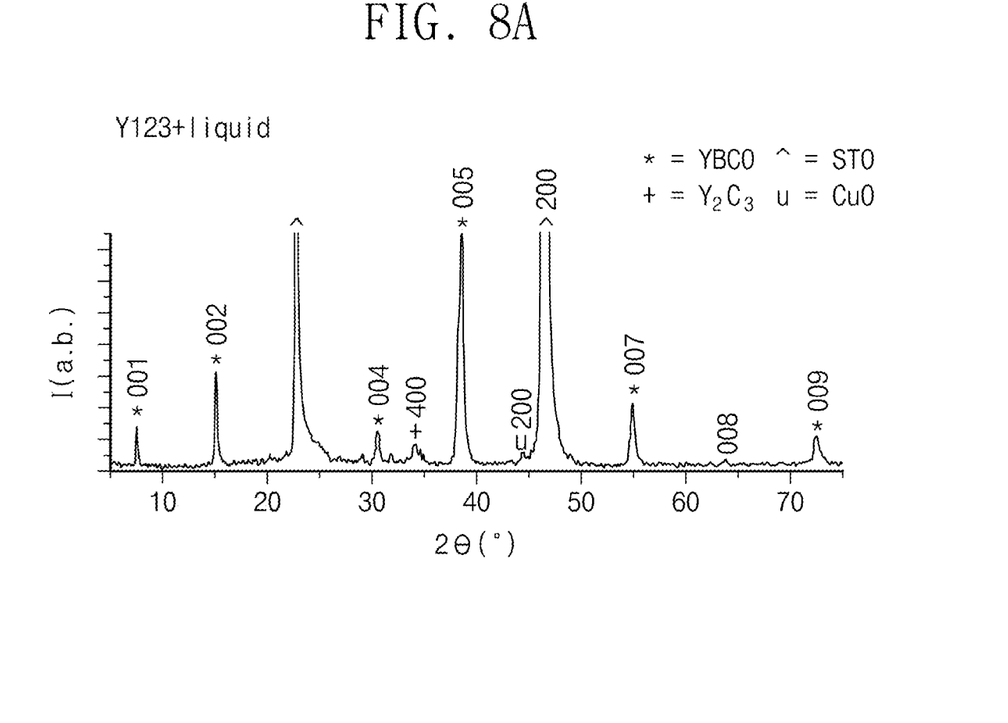
FIGS. 8A and 8B show XRD θ-2θ scans of films grown by the LAP process.
Figure 8B:
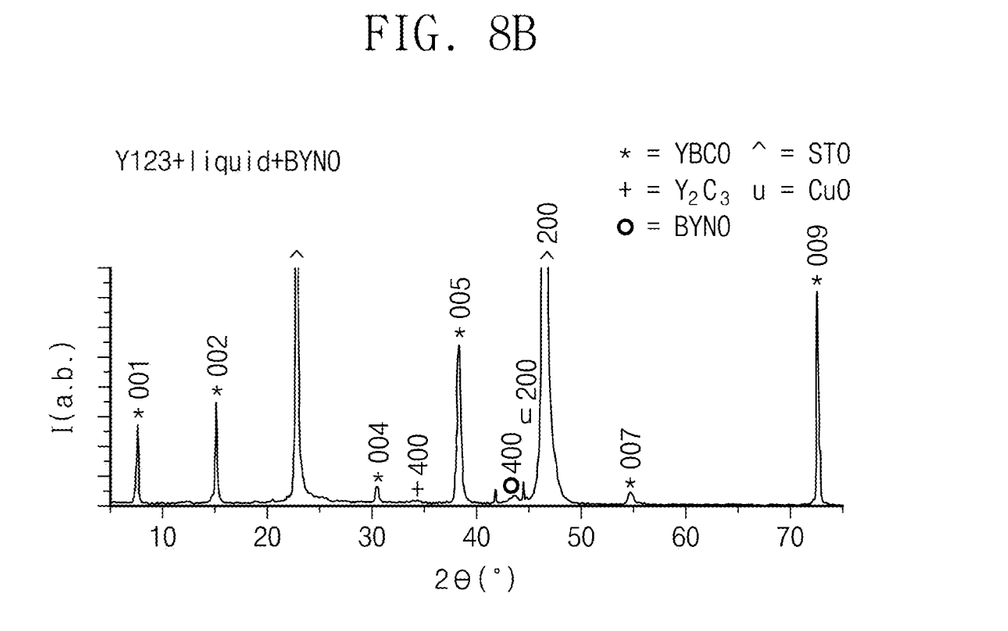

FIGS. 8A and 8B show XRD θ-2θ scans of films grown by the LAP process. The θ-2θ labels indicate: *=(001) YBCO peaks, +=004 $RE_2O_3$ peaks, U=(200) CuO peaks, o=(400) BYNO peaks, ^=(001) (substrate) STO peaks.

FIG. 8A shows XRD θ-2θ scan of an optimized YBCO film made by the undoped LAP process, i.e. the Y123+liquid (composition (b)) film. The mixed RE films showed very similar patterns in terms of sharp (001) peaks and similar second phase peaks. FIG. 8B also shows a film made by the LAP process, but now doped with BYNO, i.e. the Y123+ liquid+BYNO (composition (f)). A clear (400) BYNO peak is observed, indicating that c-axis oriented BYNO nanocolumns have been formed. This was confirmed in cross-sectional TEM images of the films (discussed later in FIGS. 13 and 14). Other phases observed in the X-ray patterns for these films and all other films grown by the LAP process are $Y_2O_3$+CuO. $Y_2O_3$+CuO are phases commonly observed in liquid processed films. $Y_2O_3$ is formed due to the excess Y and because it is epitaxially stabilized when YBCO is crystallized and CuO is formed from the liquid while the film cools after the deposition.

Figure 9A:
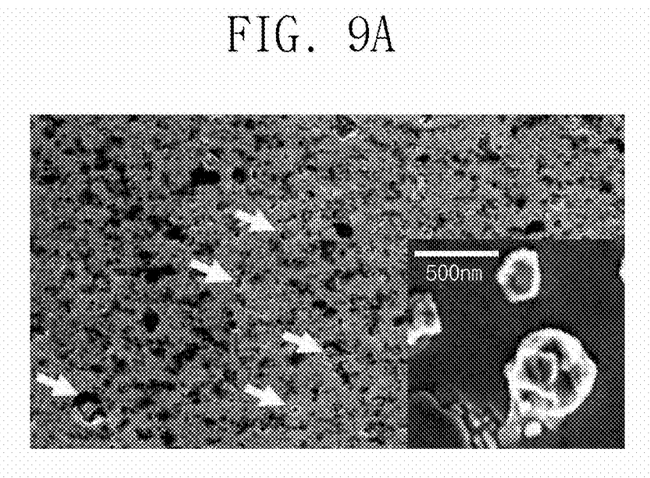
FIGS. 9A and 9B show SEM surfaces images of the Y123+liquid film of FIG. 2.
Figure 9B:
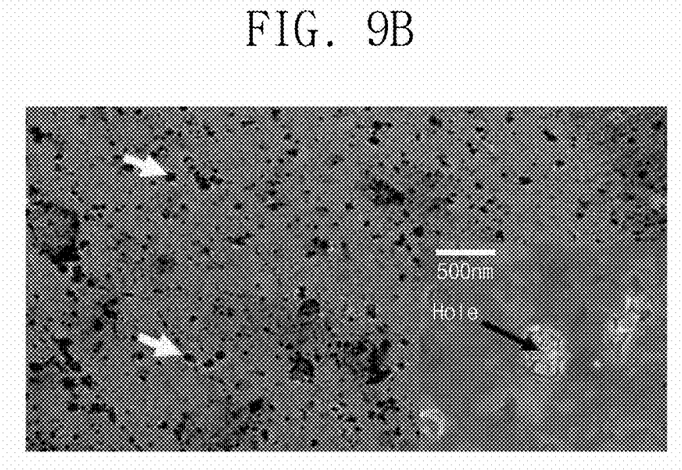

FIGS. 9A and 9B show SEM surfaces images of the Y123+liquid (composition (b)) film. There is evidence from SEM of the presence of a liquid phase in the LAP films. Referring to FIG. 9A, rounded secondary-phase particles (indicated by arrows and enlarged photograph) are shown. Referring to FIG. 9B, shallow holes surrounded by very smooth regions (indicated by arrows and enlarged photograph) are shown.

Figure 10:
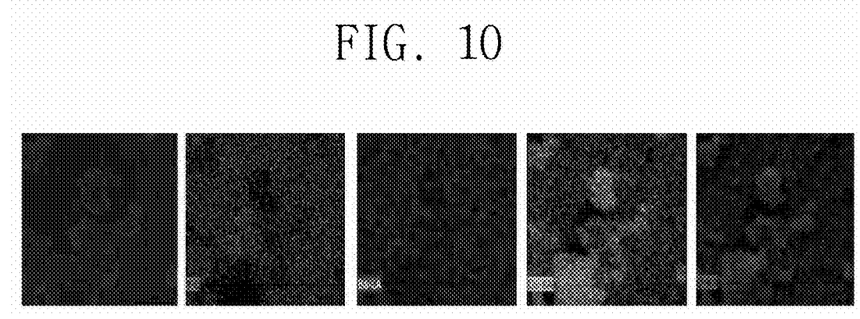
FIG. 10 shows EDX mapping of the Y123+liquid film revealing the round particles.

FIG. 10 shows EDX mapping of the Y123+liquid (composition (b)) film revealing the round particles. The round or faceted surface particles are Cu-rich, indicative of solidified Cu-rich liquid. This liquid is apparent in the phase diagram of FIG. 3. Shallow holes are likely formed due to contraction of the liquid when it solidifies upon cooling, both indicative of a surface formed from a crystallized liquid.

FIG. 11 to 14 show $J_c$ versus field, B, ∥c plots for fields up to 11 T at 70 K, 50 K, 30 K and 10 K, respectively.

The lines between points are guides for the eye only. The plot shows at least two distinctive regimes present. At higher temperatures (70 K and 50 K), three different regions are seen. The first one goes up to $B_0$, here between 1 T and 2 T, which is typical for films containing nanocolumns. The second regime is seen as dominated by an exponential decay with an α exponent given by $J_c \sim B^{-\alpha}$. The third regime shows rapid decay of $J_c$ as the matching field and irreversibility line are approached.

First, the Y123+liquid (composition (b)) film has a considerably higher $T_c$ and $J_c$ (by over an order of magnitude at many fields and temperatures) than the stoichiometric pure YBCO (Y123, composition (a)) film grown at the same rate but without LAP. The faster diffusion rates available with LAP films would have allowed for a higher quality REBCO crystalline lattice to form, and hence to much less structural perturbation than in the stoichiometric pure YBCO (Y123, composition (a)) film, leading to the much improved $T_c$ and $J_c$. This is a significant result since it is proof that even if point-like disorder is induced by the high growth rates, as might be expected for very-fast-grown stoichiometric YBCO, this alone will not be effective for increasing. $J_c$. Instead the disorder induced into REBCO (either by fast growth or by mixing REs) needs to be carefully engineered so that the REBCO lattice itself is not perturbed or disrupted to any large extent, in particular in terms of buckling of, or disconnecting the CuO planes.

Next, the $J_c$s of the mixed RE films are generally high, and more so with decreasing temperature compared to the Y123+liquid (composition (b)) film. The high $J_c$ values for the mixed RE films are exemplified by the '50K, 5T' and '10K, 10T', values shown in FIG. 7. Hence, introducing liquids into the films enables intrinsic disorder from RE mixing to be effective for pinning even when fast growth rates are used. The benefits of using RE mixing to give high $J_c$s has not been reported before for high rate grown films. This is likely because in the absence of liquids the kinetics are insufficient to 'heal' more long range disorder which is induced from the highly dense atomic disorder associated with the RE1 and RE2 ion size differences in the $RE1_{1-x}RE2_xBCO$.

Figure 11:
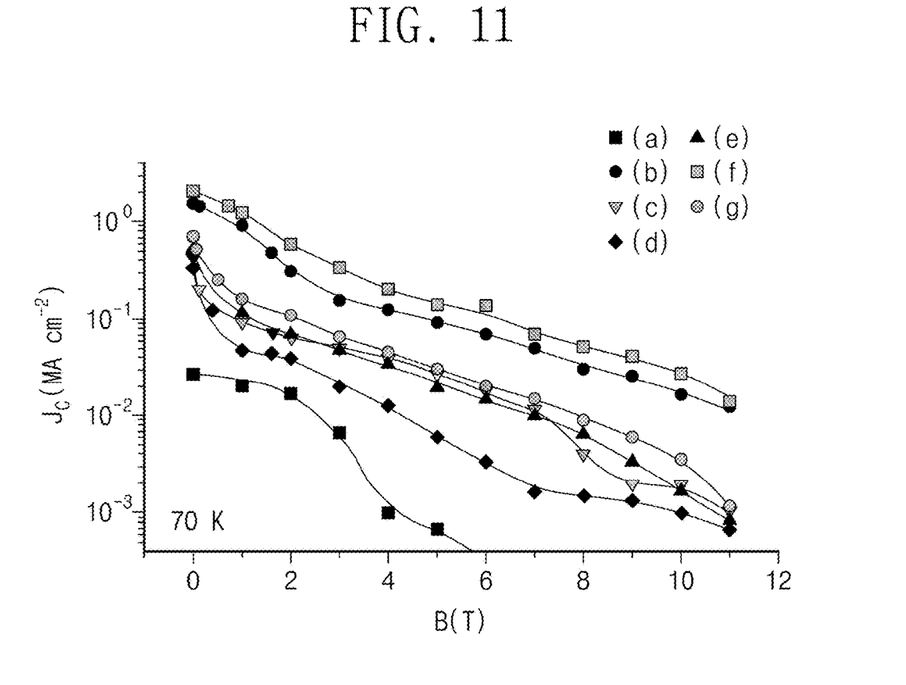
FIG. 11 to 14 show $J_c$ versus field, B∥c, plots for fields up to 11 T at 70 K, 50 K, 30 K and 10 K, respectively.

Referring to FIG. 11, at 70 K, for films where the lattice FWHM values are the same, then one would expect the BYNO-added APC films to have superior in-field $J_c$ because of the positive APC pinning effect. In line with this reasoning, the best performing film is indeed the Y123+liquid+ BYNO (composition (f)) film. One might then expect the (Y,Yb,Sm)123+liquid+BYNO (composition (g)) film to be the next in order. However, at this measurement temperature, the $T_c$ of the film is important: if $T_c$ is depressed much from 91 K, this will reduce the overall performance. Since the $T_c$ of composition (g) is somewhat depressed by the RE mixing, to 86.6 K, the pure Y123+liquid (composition (b)) film takes the second place slot, with the (Y,Yb,Sm)123+ liquid+BYNO (composition (g)) film coming third. After this, since there are no further APC doped films, the trend in $J_c$ then simply reflects the trend in $T_c$: i.e. the (Y,Yb,Sm) 123+liquid (composition (e)) film, then the (Y,Yb)123+ liquid (composition (c)) film, then the (Y,Sm)123+liquid (composition (d)) film, and then the Y123 (composition (a)). Any point pinning centers from the RE mixing are easily thermally depinned at this temperature and so produce no benefit.

Figure 12:
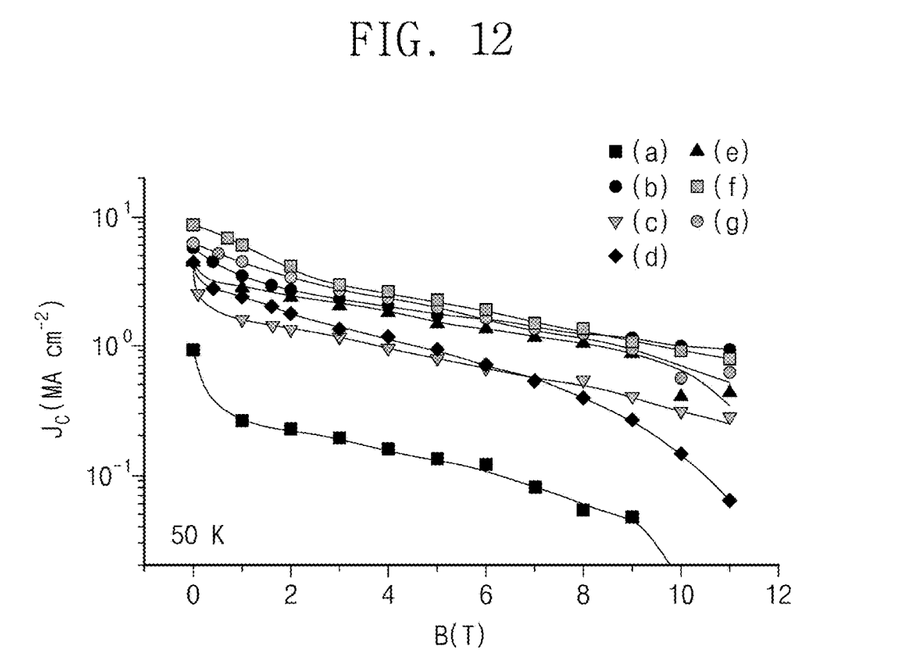

Referring to FIG. 12, at 50 K, the (Y,Yb,Sm)123+liquid+ BYNO (composition (g)) film shows a relatively improved performance compared to the 70 K data and now is close to the Y123+liquid+BYNO (composition (f)) film despite having a lower $T_c$ (86.6 K compared to 89.3 K). This reveals the strong pinning in these films from RE mixing effects, over and above the BYNO APC pinning, and the lesser importance of $T_c$. The (Y,Yb,Sm)123+liquid (composition (e)) film also shows a relatively improved performance compared to the 70 K data, despite the poorer crystallinity as revealed by the x-ray data, as discussed earlier. Finally, the (Y,Sm)123+liquid (composition (d)) film rises relative to its respective place at 70 K, although not by as much as composition (g) and (e). This is likely because both $T_c$ (86.9 K) and crystallinity are, overall, the worst in the composition (d) film compared to all the other LAP films, as shown in FIG. 7. The results indicate that the additional point disorder induced by the rare-earth mixing acts as effective pinning centers. These defects are likely to be nano-strain fields in the crystal structure arising from the different sizes of the mixed REs. As already noted, while mixed RE films grown in the absence of liquid have not, as far as known, been shown to give rise to effective point pins, this may be because of more long-range disruption of the REBCO lattice when there is no liquid to 'heal' the disruption.

Figure 13:
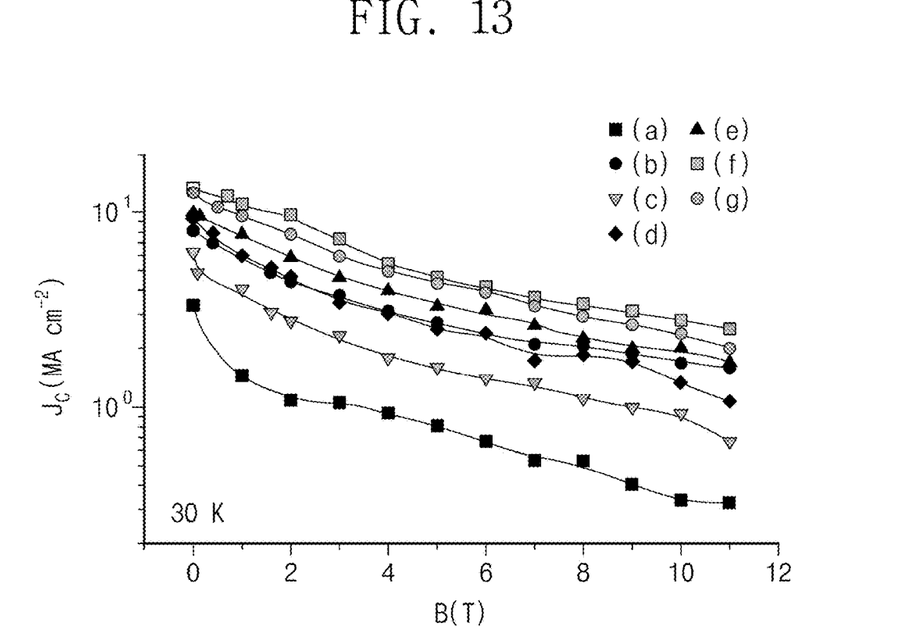

Referring to FIG. 13, at 30 K, the Y123+liquid+BYNO (composition (f)) film continues to perform the best of the films, indicative of the strong influence of pinning by the nanocolumns. The films with mixed REs show similarly good performance at 30 K compared to 50 K. Hence, the (Y,Yb,Sm)123+liquid+BYNO (composition (g)) film is nearly as good as the Y123+liquid+BYNO (composition (f)) film. However, the pure Y123+liquid (composition (b)) film falls further behind compared to 50 K and 70 K, because it has no APC or point like pinning centers engineered into it. The (Y,Yb,Sm)123+liquid (composition (e)) film is the next best, similar to at 50 K. Then, interestingly, compared to at the higher temperatures, the (Y,Sm)123+liquid (composition (d)) film swaps its order with (Y,Yb)123+liquid (composition (c)) film. This is because the effect of the lower $T_c$ of the composition (d) film is lessened (the composition (d) film has the poorest $T_c$, 86.9 K, and poorest crystallinity of all the films). Instead, its point pins from the RE mixing begin to be more effective, and there are more of them in the composition (d) than the composition (c). Overall, the 30 K data shows that both the APCs and RE mixing-related point pinning both play a stronger role in determining $J_c(B)$ and that at this lower temperature the effect of a reduced $T_c$ is lessened compared to the higher temperature measurements.

Figure 14:
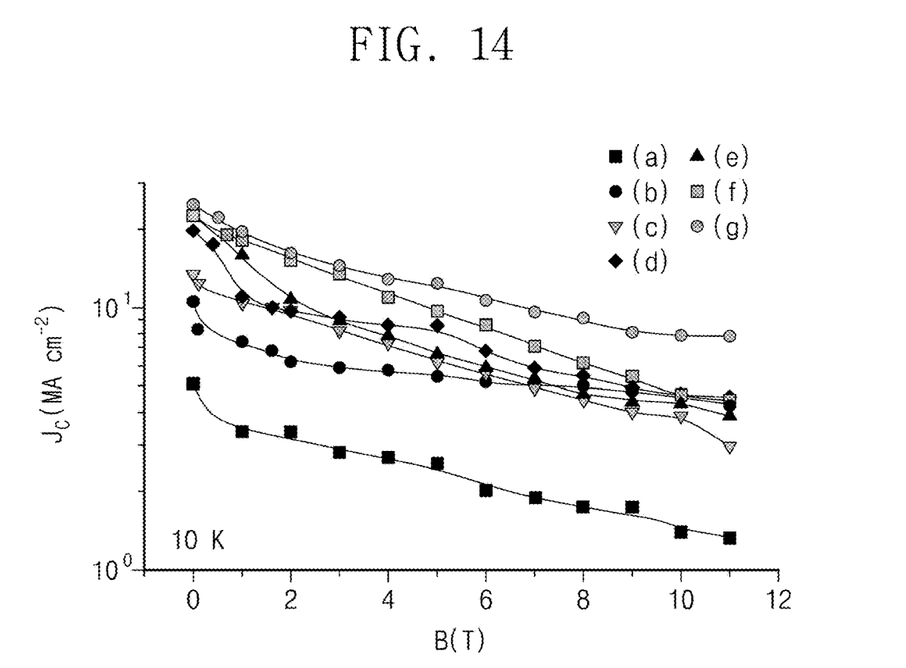

Referring to FIG. 14, at 10 K, the optimum performing film is the (Y,Yb,Sm)123+liquid+BYNO (composition (g)) film. It now outperforms the Y123+liquid+BYNO (composition (f)) film which was optimum at 30 K. This data further proves that at low temperatures both APC and mixed-RE point like pinning both play strong roles. It also shows that at the lowest temperatures the importance of point pins arising from mixing of REs increases significantly. These point pins provide a weak 0D-like pinning landscape which very effectively supplements the stronger pinning defects arising from the APC columns, leading to very high pinning forces at 10 K, despite the 4-60 times faster growth rates.

In terms of the performance of these films compared to other liquid processed films grown at similar rates, e.g. an ex-situ film made by SuNAM Ltd, the $J_c$ for films in this invention are up to three times higher at 3 T, and six times higher at 5 T. Also, compared to standard stoichiometric YBCO films with $BaZrO_3$ and $Ba_2Y(Nb,Ta)O_6$ pinning additives, the in-situ LAP films show similar performance over a range of fields from 70 K to 30 K and they outperform these standard APC films at 10 K (by up to a factor of 2), despite being grown 4-60 times faster.

Figure 15A:
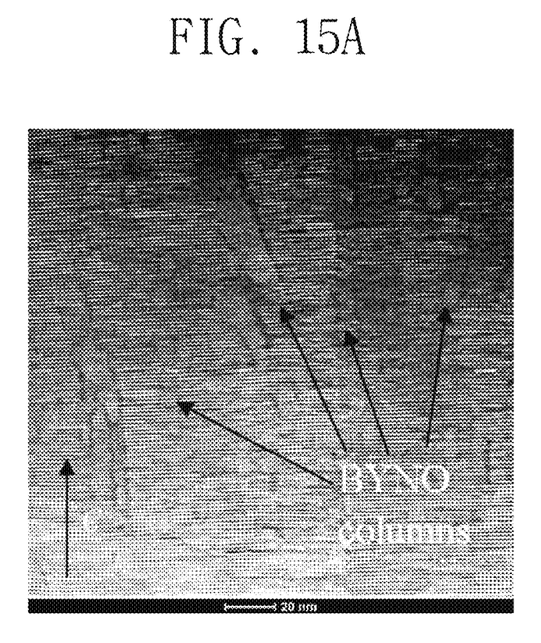
FIG. 15A shows Cross sectional TEM image of the Y123+liquid+BYNO film.
Figure 15B:
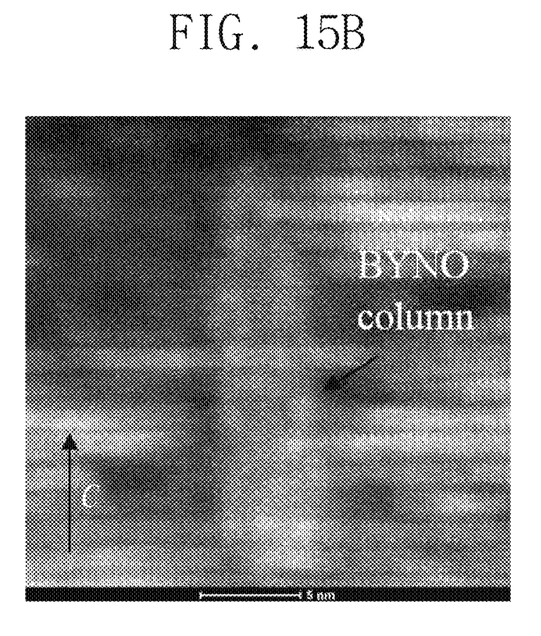
FIG. 15B is an enlarged image of FIG. 15A.

FIG. 15A shows a cross sectional TEM image of the Y123+liquid+BYNO (composition (f) film. FIG. 15B is an enlarged image of FIG. 15A. While it is not possible to image the point-like defects arising from the RE mixing by TEM, it is still important to confirm the nature of the BYNO APC additions to the films.

Referring to FIGS. 15A and 15B, the c-axis oriented BYNO nanocolumns are shown. Hence BYNO nanocolumns have time to be assembled despite the very fast growth rates which have typically prevent APCs assembling into well-formed columns. The columns are about 3~10 nm in diameter (about 5 nm in FIG. 15B), spacing about 10~30 nm, with about 40 nm long segments stacked on top of one another. The YBCO lattice between the columns remains highly aligned between the dense, fine columns. Although the columns are shorter than the through-thickness columns reported under standard growth conditions for some APCs, this is likely not because of a kinetic limitation, but rather because of strain and thermodynamic factors related to BYNO which has a large lattice mismatch with YBCO.

The BYNO columns would be expected to act as very strong extended 1D pinning centers for B∥c, explaining the observed behavior seen in the $J_c$ measurements. Also, the density of columns is high enough that there are likely to be 'secondary-effect' point like defects associated with the columns as they disrupt the REBCO matrix around themselves. This has been effectively seen for MOCVD conductors with 15 at. % $BaZrO_3$ additions.

Finally, the LAP process demonstrated here for PLD growth could also easily be adapted to other physical or chemical vapor depositions methods to achieve very high-performance conductors at an order of magnitude higher rate, and hence at lower cost.

Fast growth of REBCO coated conductors with strong pinning is essential to reduce the cost of superconducting applications. This invention presents the results of a new in-situ liquid assisting processing (LAP) method that utilizes PLD deposition. The method allows for very fast growth rates (up to 250 nm/s), i.e. more than an order of magnitude faster than standard films. The method enables extended $Ba_2YNbO_6$ nanocolumnar artificial pinning centers (APCs) to form despite the very fast growth rates, as well as point-like defect pinning centers to be created by having mixed rare-earths in the films. The mixed pinning, mixed RE+BYNO LAP films were shown to be very effective for pinning at 10 K, 30 K and 50 K. Compared to standard YBCO films grown by PLD with different APC pinning additives, despite the much faster growth rates, the LAP films showed similar Jcs over a range of fields from 70 K to 30 K, while at 10 K they outperformed the standard films by up to a factor of 2 times. An increasing influence of point-like pinning from RE mixing in the films at lower temperatures was demonstrated. The LAP method holds much promise for lowering coated conductor cost compared to growth using standard in-situ vapor growth methods, simply by modifying the composition of the target material.

The present invention is related to applications where high critical currents (for example, ≥1000 A) can be achieved in high fields, for example above 5 T which means operating at ~30 K or below. According to the present invention, the superconducting wire can be made at lower cost and provided at fast growth rates with strong pinning of magnetic vortex.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of forming a superconducting wire, comprising:
    forming a buffer layer on a substrate; and
    providing a superconducting precursor on the buffer layer, to form a superconducting film including $Y_{1-x}RE_xBCO$ on the substrate,
    wherein:
    $0 < x \leq 1$,
    the superconducting film has a first composition ratio of Y+RE and Cu relative to Ba,
    the superconducting precursor is provided using a source including Y+RE, Ba, and Cu,
    the source has a second composition ratio of Y+RE and Cu relative to Ba, and
    the second composition ratio is greater than the first composition ratio.

2. The method of claim 1, wherein $0.5 < x < 0.95$.

3. The method of claim 1, wherein RE is Yb, Sm or a combination of Yb and Sm.

4. The method of claim 1, wherein the source further includes an additive of $Ba_2YNbO_6$.

5. The superconducting wire of claim 1, wherein RE includes a first element having a smaller ionic radius than that of Y and a second element having a larger ionic radius than that of Y.

6. The method of claim 5, wherein the first element includes Yb and the second element includes Sm.

7. The method of claim 1, wherein the superconducting precursor is provided in the range of 800~850° C.

8. The method of claim 1, wherein the superconducting film further includes $Y_2O_3$ and liquid phase.

9. A method of forming a superconducting wire, comprising:
    forming a buffer layer on a substrate; and
    providing a superconducting precursor on the buffer layer, to form a superconducting film including $Y_{1-x}RE_xBCO$ on the substrate,
    $0 < x \leq 1$,
    the superconducting film has a first composition ratio of Y+RE and Cu relative to Ba,
    wherein the superconducting precursor is provided using a source including Y+RE, Ba, and Cu,
    the source has a second composition ratio of Y+RE and Cu relative to Ba,
    the second composition ratio is greater than the first composition ratio, and
    wherein RE includes a first element having a smaller ionic radius than that of Y and a second element having a larger ionic radius than that of Y.

10. The method of claim 9, wherein the first element includes Yb and the second element includes Sm.

11. The method of claim 10, wherein the source further includes an additive of $Ba_2YNbO_6$.

* * * * *